(12) United States Patent
Kimoto (10) Patent No.: US 7,423,441 B2
(45) Date of Patent: Sep. 9, 2008

(54) CONTACTOR ASSEMBLY

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 0 days.

(21) Appl. No.: 11/888,563

(22) Filed: Aug. 1, 2007

(65) Prior Publication Data
US 2008/0030216 A1 Feb. 7, 2008

(30) Foreign Application Priority Data
Aug. 7, 2006 (JP) ............................ 2006-239544

(51) Int. Cl.
*G01R 31/02* (2006.01)
(52) U.S. Cl. ...................................... 324/762; 324/754
(58) Field of Classification Search ........................ None
See application file for complete search history.

(56) References Cited

U.S. PATENT DOCUMENTS

| | | | | |
|---|---|---|---|---|
| 3,611,128 A * | 10/1971 | Nagata | ....................... | 324/72.5 |
| 4,116,523 A * | 9/1978 | Coberly et al. | ............... | 439/578 |
| 5,599,194 A * | 2/1997 | Ozawa et al. | ................. | 439/72 |
| 6,034,534 A * | 3/2000 | Kiyota | ........................ | 324/762 |
| 6,271,674 B1 * | 8/2001 | Hasegawa et al. | ............ | 324/754 |
| 6,489,795 B1 * | 12/2002 | Klele et al. | .................. | 324/762 |
| 2007/0063718 A1 * | 3/2007 | Kimoto | ....................... | 324/754 |
| 2007/0200578 A1 * | 8/2007 | Kimoto | ....................... | 324/754 |
| 2007/0216433 A1 * | 9/2007 | Miura et al. | ................. | 324/762 |

* cited by examiner

*Primary Examiner*—Paresh Patel
(74) *Attorney, Agent, or Firm*—Haynes and Boone, LLP (57) ABSTRACT

A contactor assembly suitable for high frequency testing and having a large overdrive is to be provided. For this purpose, there is realized a multiple beam-synthesized type contactor assembly including: a resin film constituting a base material; an electroconductive pattern formed over the resin film and made up of an electric conductor including a vertical probe; an electroconductive beam having a linear or curvilinear shape of which one end is fixed and the other is connected to the vertical probe; and one deformable beam extending substantially in parallel to the electroconductive beam, wherein the electroconductive beam and deformable beam(s) are firmly fixed mechanically in the vicinity of the vertical probe to constitute a cantilever of a parallel spring structure, the electroconductive beam and deformable beam(s) have an electrical characteristic of being electrically conductive or electrically non-conductive, and plural the resin films each with a vertical probe are stacked.

36 Claims, 8 Drawing Sheets

CONTACTOR ASSEMBLY

CROSS REFERENCE

This application claims priority to Japanese patent application number 2006-239544, filed Aug. 7, 2006, the disclosure of which is incorporated herein by reference.

BACKGROUND OF THE INVENTION

1. Field of the Invention

The present invention relates to a contactor assembly of a prober apparatus for use in circuit inspection of plural semiconductor chips formed over a semiconductor wafer in the fabrication of an electronic device, such as an LSI, and more particularly to multiple beam-synthesized type contactor assembly used in a prober apparatus for use in a probing test to collectively measure the electrical conduction characteristics of semiconductor chips by bringing vertical probes into contact with circuit terminals (pads) arrayed on semiconductor chips intact in a wafer state.

2. Description of Prior Art

Along with the advancement of semiconductor technology, the scale of integration of electronic devices has become enlarged and the area occupied by circuit wiring in each of the semiconductor chips formed over a semiconductor wafer has become greater, resulting in an increase in the number of circuit terminals (pads) on each semiconductor chip, and this problem is being addressed by miniaturization of pad arrays through contraction of the pad area and of the pad pitch. At the same time, the chip size package (CSP) system in which semiconductor chips are not accommodated in a package and instead mounted bare over a circuit board or the like is becoming the main stream, and this makes it indispensable to check the characteristics and determine the acceptability of the wafer before it is divided into semiconductor chips.

A particular problem ensuing from the miniaturization of pad arrays (narrowed pitch) is that the probe structure for achieving electrical continuity by establishing contact with the pads of semiconductor chips in subjecting an electronic device to electrical characteristics tests or circuit inspection should be matched with the miniaturization of pad arrays, and various measuring devices or methods are used to keep abreast of this increasing miniaturization of pad arrays.

For instance, there is a method to have a contactor assembly, which includes plural acicular probes each having an elastic deformable part which is elastically deformed by an external force, intervene between the pads of semiconductor chips and the testing device. This contactor assembly and the test circuit of semiconductor chips are electrically connected by a printed circuit board known as a probe card.

Generally in a probe card, where acicular probes having a cantilever structure are used, the tips of probes in contact with the pads of semiconductor chips are arrayed in a narrow pitch. However, the root parts in contact with the probe card can be wider in pitch because probes are radially arranged, expanding toward the tips, and enables the probes to be soldered, or otherwise fitted, to the circuit terminals of the probe card. This cantilever structure, however, involves a problem that the probe tips, when coming into contact with pads, deviate in the horizontal direction and therefore damage the pads or go off the pads to invite a drop in measurement yield. Furthermore, only one chip can be measured at a time. The fitting accuracy varies from probe to probe, making it difficult to control the contact pressure to a constant level.

In vertical probes, in which probes are vertically fixed to the circuit terminals of a probe card instead of being cantilevered, the pitch of pads on the semiconductor chips and that of circuit terminals on the probe card have to be equal. However, available manufacturing techniques are not adequate for required miniaturization of the circuit pattern on the probe card, which is a printed circuit board, and it is therefore difficult to meet the requirement to match the area occupied by circuit terminals and the wiring width with the pad pitch. Furthermore, as there is a limit to the pitch that allows soldering, it becomes impossible to keep up with the advancement of miniaturization in fixing the vertical probes vertically to the probe card to match the pad pitch of the semiconductor chips.

Thus, a large proportion of the planar area is occupied by the circuit wiring width in addition to the area of circuit terminals on the probe card, preventing the pitch of circuit terminals from being narrowed. To address this problem, the number of vertical probes is maintained by use of a multi-layered printed circuit board as the probe card, arraying circuit terminals in a grid form or a two-row zigzag pattern and electrically connecting inter-layer wires by through holes. However, as these through holes occupy a large space, the presence of the through holes constitutes a cause of preventing the pitch of circuit terminals from being narrowed. Thus, an attempt to fix vertical probes to the probe card in this way involves the need for sophisticated skills and a large number of man-hours in soldering in addition to the difficulty to narrow the pitch of circuit terminals, resulting in a high cost. In order to solve these problems, the present inventors proposed a vertical contactor assembly, and have also proposed a prober apparatus using this vertical contactor assembly (see Patent Document 1 and Patent Document 2).

The vertical contactor assembly proposed by the present inventors, cited here as an instance of the prior art, includes vertical copper probes each formed by sticking a thin copper sheet onto the surface of a ribbon-shaped (strip-shaped) resin film and etching this copper sheet to create a curved part in the resin film surface as shown in FIG. 22 of Patent Document 2, and the vertical contactor assembly is configured by stacking plural these probe-stuck resin films.

This vertical contactor assembly, since it is structured by stacking resin films, permits arrangement of plural probes in a very limited area and, as each resin film has an aperture and the vertical part of each probe is curved on the way along the edge of the aperture, the distortion due to the pressure when the tips of the probes have come into contact with the pads can be absorbed by the apertures in the resin films and the curved parts of the probes.

Regarding the way to let the pressure work on the probes and resin films during measurement, the inventors have proposed various shapes by designing in different ways the size and shape of the apertures of the resin films and the curved shape of the probes. In particular, they recently proposed probes whose electric conduction pattern is linked with a multiple beam-synthesized type contactor assembly. However, even though a contactor assembly adapted to a narrowed pitch is made available, more complex machining of resin films and probes involves a problem of increased costs.

Patent Document 1: JP-A-338133/2000
Patent Document 2: JP-A-274010/2004

As stated above, the prober apparatus using a film-stacked type vertical contactor assembly proposed by the present inventors is applicable to measurement of semiconductor chips whose pad pitch is as narrow as 45 µm or less (20 µm for instance). Moreover, as it permits automatic assembling of probes without needing fixation by soldering or with resin, such apparatuses can be mass-produced at low cost, and provide an additional major advantage of allowing the contact pressure to be uniformly controlled for every probe because collective vertical contact with chip pads is possible.

However, this earlier proposed contactor assembly configuration involves a problem of increased electrostatic capacitance, which makes it unsuitable for measurement, when it is to be applied to the testing of a device for high frequency use because of the absence of a magnetic shield function.

Moreover, where plural chips having rectangularly arrayed pads are to be tested at the same time, if any overlapping in the z-direction (the vertical direction, the same applies in the rest of this specification) occurs, a parallel spring link mechanism makes the vertical probes taller on account of the narrow spacing between adjoining chips, making the probes susceptible to buckling or deformation.

A first object of the present invention is to provide a contactor assembly which has a simple structure of a small surface area, close to the cantilever structure, for the shape of vertical probes to be formed over resin films, in which a parallel spring structure is formed between electroconductive beams and deformable beams by having the utilization of the deformable beams among cantilevers, whose electrical characteristic in particular is small in electrostatic capacitance and which are unrelated to electrostatic capacitance, and whose vertical probes are given a mechanical characteristic of allowing the overdrive due to parallel operation to be increased.

A second object of the invention is to provide a multiple beam-synthesized type contactor assembly which is made easier to machine, features of which include a reduction in the number of man-hours spent on the formation of apertures in resin films.

A third object of the invention is to provide a contactor assembly which is made usable, in the manufacturing processes of electronic devices such as LSIs, in probing tests to collectively measure the electrical conduction characteristics of semiconductor chips by bringing vertical probes still in a wafer state into contact with circuit terminals (pads) arrayed on multiple chips, and also usable as contactors for checking the lighting of liquid crystals.

SUMMARY OF THE INVENTION

According to a first aspect of the present invention, there is provided a multiple beam-synthesized type contactor assembly, each contactor including: a resin film constituting a base material; an electroconductive pattern formed over the resin film and made up of an electric conductor including a vertical probe; an electroconductive beam having a linear or curvilinear shape of which one end is fixed and the other is connected to the vertical probe; and one or plural deformable beams extending substantially in parallel to the electroconductive beam, wherein the electroconductive beam and deformable beam(s) are firmly fixed mechanically in the vicinity of the vertical probe to constitute a cantilever of a parallel spring structure; the electroconductive beam and deformable beam(s) have an electrical characteristic of being electrically conductive or electrically non-conductive; and plural the resin films each with a vertical probe are stacked, and circuit testing of semiconductor chips is carried out by collectively bringing the tips of the vertical probes into contact with the electrode pads of the semiconductor chips.

According to a second aspect of the invention, there is provided a multiple beam-synthesized type contactor assembly, each contactor including: a resin film constituting a base material; an electroconductive pattern formed over the resin film and made up of an electric conductor including a vertical probe; an electroconductive beam forming a parallel spring link mechanism having a parallelogrammatic shape and connected to the vertical probe; two or more deformable beams provided integrally with the electroconductive beam; and a dummy part provided in the parallel spring link mechanism part in a state of being electrically insulated from the electroconductive beam, wherein plural such resin films each with a vertical probe are stacked, and circuit testing of semiconductor chips is carried out by collectively bringing the tips of the vertical probes into contact with the electrode pads of the semiconductor chips.

According to a third aspect of the invention, there is provided a version of the multiple beam-synthesized type contactor assembly according to the first aspect wherein the electroconductive pattern includes one or plural grounding lines and one or plural signal lines.

An advantage of the present invention is that the utilization of signal lines and non-signal lines (such as grounding lines and dummy lines), a resin printing part or the like enables a simulated parallel spring link mechanism to be formed and thereby to provide the vertical probes with a substantially vertical and large overdrive.

According to the invention, unlike in the case of configuring a parallel spring link mechanism only of signal lines, the space of signal lines in the z-direction is made smaller and accordingly, even if the signal lines are arranged with phase differences with a view to increasing the intervals between them in the z-direction, the overall height of the contactor assembly in the z-direction is not increased, making it the buckling of vertical probes unlikely to occur and enabling a low electrostatic capacitance contactor assembly to be obtained.

The invention provides a further advantage of enabling a grounding pattern occupying a large area to be formed, which is so arranged as to oppose adjoining signal lines to obtain a contactor assembly less susceptible to magnetic interference.

The invention further enables, by arranging dummies near the vertical probes, the vertical probes to be prevented from being buckled or deformed. The presence of the grounding parts serves to reduce the electrostatic capacitance and to add the magnetic shield effect, thereby making the contactor assembly applicable to the testing of devices for high frequency use.

BRIEF DESCRIPTION OF THE DRAWINGS

FIGS. 1A to 1D illustrate spring structures, wherein FIG. 1A, FIG. 1B and FIG. 1C show the motions of the tips of the respective vertical probes;

DETAILED DESCRIPTION OF THE PREFERRED EMBODIMENTS

Preferred embodiments of the present invention have two major features.

One is that resin films to which copper foils are adhered are used to form electric conductors each including a vertical probe over the resin films by etching the copper foils (beryllium copper or the like) and stacking plural such resin films with vertical probes, and the resultant contactor assembly is used for circuit testing of semiconductor chips by collectively bringing the tips of vertical probes into contact with pads of the semiconductor chips, wherein the contactor assembly is a multiple beam-synthesized type contactor assembly having a linearly or curvilinearly shaped electroconductive beam of which one end is fixed and the other is connected to vertical probes and one or plural deformable beams substantially parallel to the electroconductive beam, wherein the electroconductive beam and the deformable beams are fixed firmly in the mechanical sense in the vicinities of the vertical probes and each beam is electrically conductive or non-conductive. In the multiple beam-synthesized type contactor assembly that is provided, the vertical probes over the resin films are formed into a simple structure which is small in surface area, closely resembling a cantilever structure, and a parallel spring structure is formed between the electroconductive beam and the deformable beams by having the utilization of deformable beams, whose electrical characteristic is to reduce the electrostatic capacitance in particular of cantilevers and which are unrelated to electrostatic capacitance, and the vertical probes are given a mechanical characteristic of allowing the overdrive due to parallel operation to be increased.

A second feature is that, as stated with reference to the second aspect of the invention, resin films to which copper foils are adhered are used to form an electroconductive pattern including vertical probes over the resin films by etching the copper foils (beryllium copper or the like) and stacking plural these resin films with vertical probes, and the resultant contactor assembly is used for circuit testing of semiconductor chips by collectively bringing the tips of vertical probes into contact with the pads of semiconductor chips, wherein, in addition to the contactor assembly according to the first aspect of the invention in which the electroconductive patterns including the vertical probes form a link mechanism of parallel springs having a parallel spring structure and two or more of the electroconductive patterns of the vertical probes are utilized and synthesized in the parallel spring structure, dummy parts are utilized in the parallel spring structure. In the resultant contactor assembly, the formation of the dummy parts elsewhere than the electroconductive patterns over the resin films enables the strength of the resin films to be increased and at the same time vertical probes to be prevented from being deformed by buckling.

The parallel springs in the context of the invention are plural beams of substantially the same shape which are arranged in parallel, the two ends each of the plurality of beams are fixed to common supports which are not deformed, and move in parallel within a certain range when one support is fixed and the other is moved.

Exemplary embodiments of the invention will be described below with reference to the accompanying drawings. These embodiments are not meant to limit the scope of the invention.

Exemplary Embodiment 1

Figure 1A:
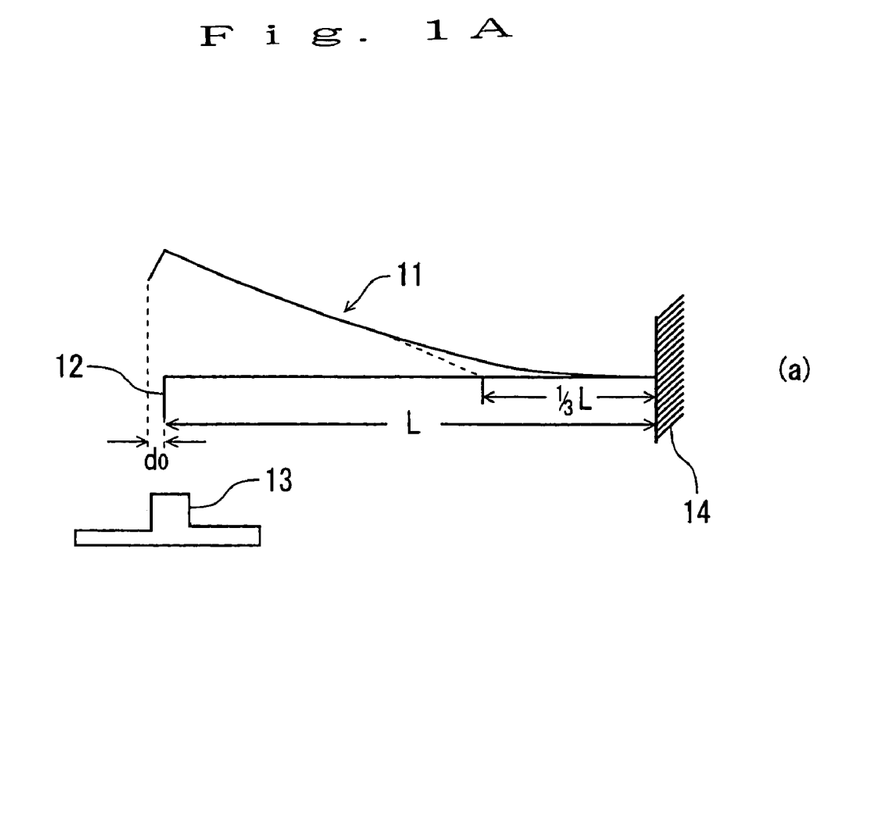
Figure 1B:
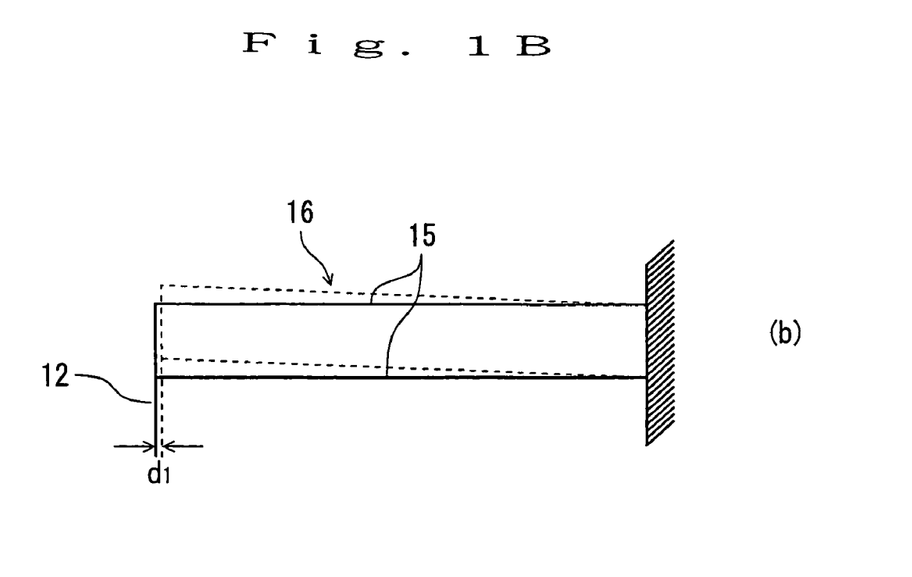
Figure 1C:
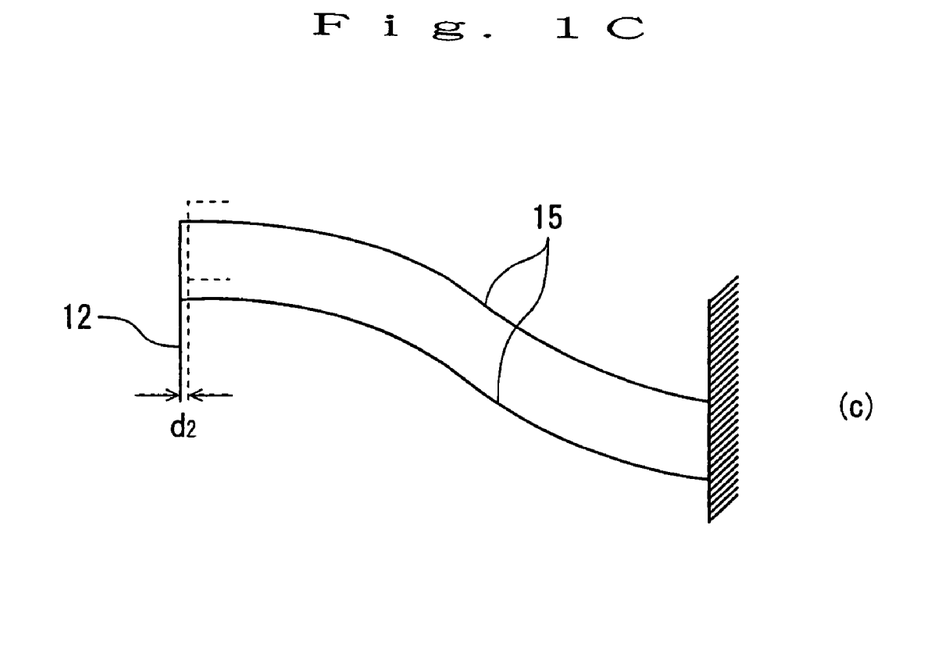

A first exemplary embodiment of the invention will be described first with reference to drawings. FIGS. 1A to 1D illustrate the invention, wherein FIG. 1A, FIG. 1B and FIG. 1C show the spring structure of contactors positioned as examples of the prior art to the invention and the motions of the tips of the respective contactors. The tip of each contactor is kept vertical until it comes into contact with the pad part of a semiconductor chip or the like.

FIG. 1A shows an example of contactor having a simple cantilever structure. This contactor includes a cantilever 11 of a length L and a vertical probe 12 fitted to the tip of the cantilever 11. In this contactor, the tip of the vertical probe 12 fitted to the tip of the cantilever 11 vertically opposes the upper face of the pad part 13 of a semiconductor chip or the like. The other end of cantilever 11, fitted to a supporting part 14 in a fixed manner, is in a horizontal state. Next, when either the pad part 13 is raised or the supporting part 14 is lowered for the testing purpose, the tip of the vertical probe 12 and the upper face of the pad part 13 come into contact, and the cantilever 11 of the length L rotates around a position is calculated to be about ($\frac{1}{3}$)L, and the tip of the vertical probe 12 moves significantly by a distance of d0 while remaining in contact with the upper face of the pad part 13. As a result, the tip of the vertical probe 12 may come off the pad part 13 or the upper face of the pad part 13 may be shaved off to leave a scratch.

To eliminate such undesirable consequences, in the example of contactor shown in FIG. 1B, the cantilever 11 is configured in a structure using parallel springs 15, and the vertical probe 12 is disposed at one end of a link 16. In this link structure, even if a contact load in the same vertical direction as in FIG. 1A works on the vertical probe 12, the link structure can keep the moving distance d1 of the tip of the vertical probe 12 very small:

$$d1 < d0$$

The example of contactor shown in FIG. 1C is a link structure in which the shape of the parallel springs 15 constituting the cantilever 11 is deformed in advance and, in this case too, the moving distance d2 of the vertical probe 12 can be kept very small:

$$d2 < d0$$

Figure 1D:
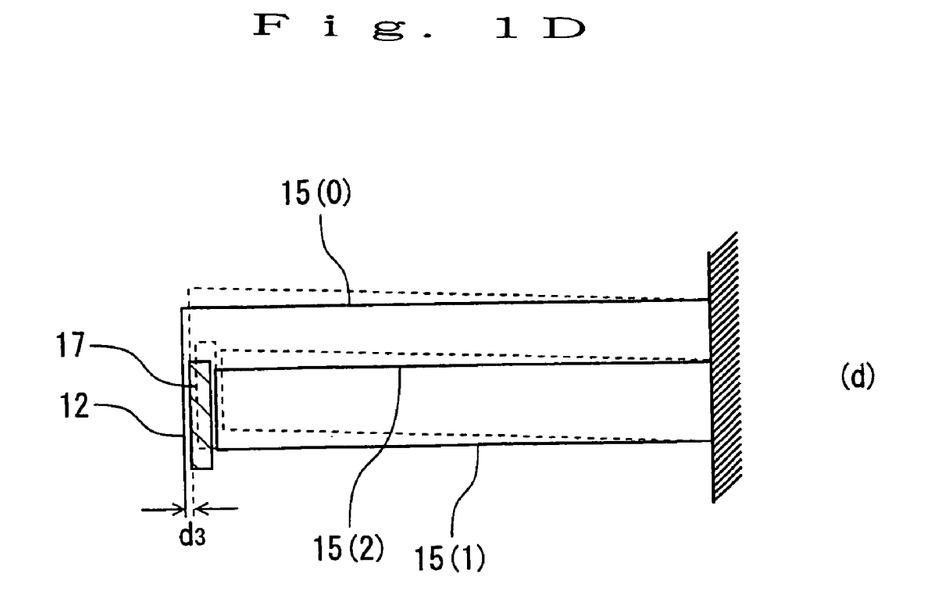

FIG. 1D illustrates the principle by way of a model of the structure and operation of a contactor according to the invention. The contactor illustrated herein includes three cantilevers denoted by reference signs 15(0), 15(1) and 15(2) and has a parallel spring structure. The cantilever 15(0) constituting part of this contactor has a similar structure to what is shown in FIG. 1A, a vertical probe 12 being fitted to its tip. The tip of the vertical probe 12 vertically opposes the upper face of the pad part 13 of a semiconductor chip or the like. The other end of cantilever 15(0), fitted to a supporting part 14 in a fixed manner, is in a horizontal state. The cantilevers 15(1) and 15(2), like the one shown in FIG. 1B, have a parallel spring-based link structure in which the two members are integrally combined at their tips. However, no vertical probe is fitted to the parallel spring part including the cantilevers 15(1) and 15(2). The reason is that the cantilever 15(0) and the vertical probe 12 fitted to its tip conduct electric signals. Further, the cantilever 15(0) and the parallel spring part including the cantilevers 15(1) and 15(2) are linked by a joining member 17 at their tips into an integrated structure. Therefore in this exemplary embodiment, the integration of the cantilevers 15(0), 15(1) and 15(2) constitutes triple-structured parallel springs to realize a contactor in which plural beams are synthesized. In these triple-structured parallel springs, the cantilever 15(0) is made of metal and functions as an electroconductive beam to let electric signals flow to the vertical probe 12. On the other hand, the cantilevers 15(1) and 15(2), which may be made of a metallic or non-metallic material, function as deformable beams which are enabled to generate prescribed spring forces by being deformed. In the case illustrated in FIG. 1D, quadruple parallel springs or ones of even higher multiplicity can be configured by adding cantilever parts. The joining member 17 may made of resin or some other insulating material and, even if both the cantilever 15(0) and the parallel spring part including the cantilevers 15(1) and 15(2) are made of a metallic material, electricity is prevented from being conducted between the two members.

In such a configuration, where one end of each of the cantilevers 15(0), 15(1) and 15(2) is fixed and at the other ends the three beams are mechanically joined to constitute parallel springs, if substantially equal forces work on the three springs, a substantially vertical operational locus (substantially the same operational locus as in FIG. 1B) will be obtained if the three beams are of the same shape. In this exemplary embodiment, the cantilevers 15(1) and 15(2) are made of metal, and their tips are integrated by a copper foil for instance. The vertical probe 12 and the tips of the cantilevers 15(1) and 15(2) are firmly linked by the joining member 17. A more specific example of structure shown in FIG. 1D will be described in detail with reference to FIG. 3 and FIG. 4 (to be cited subsequently) which illustrate a second exemplary embodiment.

Figure 2:
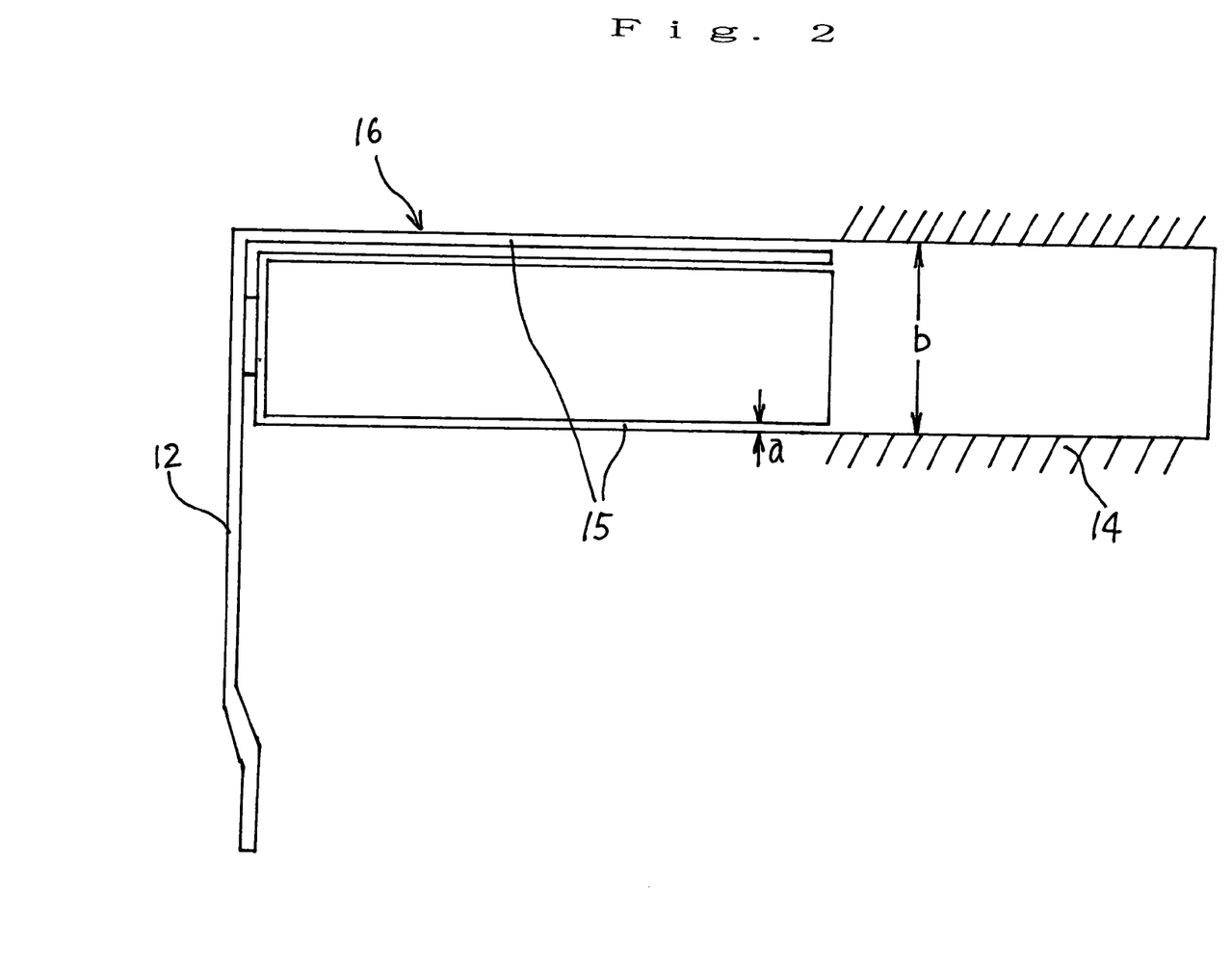
FIG. 2 shows an expanded view of the vertical probe in the first exemplary embodiment of the invention.

Next, the first exemplary embodiment of resin films having vertical probes according to the invention, to which the principle described with reference to FIGS. 1A to 1A is applied (hereinafter to be referred to as multiple beam-synthesized type contactor), will be described with reference to a plan shown in FIG. 2. As shown in FIG. 2, a beryllium copper sheet of 20 μm in thickness is used for the cantilever-structured probe to be formed over the resin film, and what includes this copper sheet stuck to a polyimide resin film of 5 μm in thickness is formed by etching.

This multiple beam-synthesized type contactor includes the vertical probe 12, the parallel springs supporting this vertical probe 12 at one end and the supporting part 14 supporting the parallel springs 15 at the other end, only the tip of the vertical probe 12 slightly protrudes outside the resin film. Regarding the size of the parallel springs 15, the width a of one string is assumed to be, for instance, 20 μm as shown in FIG. 2, and the overall width b of the link 16 is assumed to be 0.4 to 1 mm. Where the spring width is narrow as in this example, no aperture may be provided in the resin film between the parallel springs 15 to strengthen the resin film itself against deformation and only the copper foil to be worked on to strengthen the parallel springs 15.

Exemplary Embodiment 2

Figure 3:
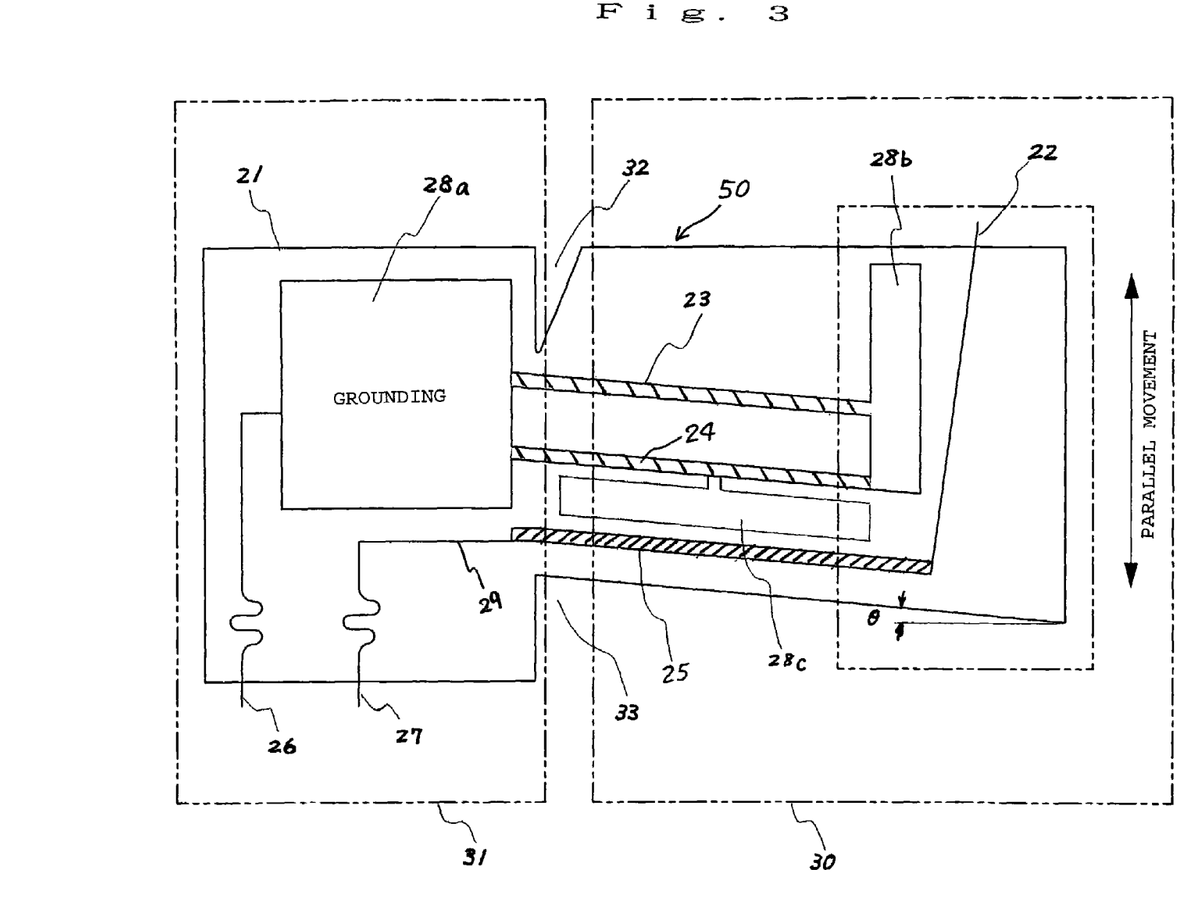
FIG. 3 shows a schematic profile of a multiple beam-synthesized type contactor, which is a second exemplary embodiment of the invention.

FIG. 3 shows a schematic profile of a multiple beam-synthesized type contactor, which is a second exemplary embodiment of the invention. In FIG. 3, the vertical relationship is reverse to that in FIG. 1D. As shown in FIG. 3, one each contactor 50 has a configuration using a resin film 21 to which a metal film, such as a copper foil is stuck, and a vertical probe 22, deformable beams 23 and 24, and an electroconductive pattern including an electroconductive beam 25, grounding parts 28a, 28b and 28c and a signal line 29 are formed by etching the copper foil over the resin film 21. By stacking plural such contactors 50 at prescribed intervals, a multiple beam-synthesized type contactor assembly is configured.

The electroconductive pattern is a pattern permitting electric conduction except in dummy parts (to be described afterwards), and includes a signal communicating part and a grounding action part. The signal communicating part includes the vertical probe 22, the electroconductive beam 25 which is formed of a cantilever-structured pattern and whose tip is connected to the vertical probe 22, a signal line 29 connected to the base end of the electroconductive beam 25, and a signal line terminal part 27 disposed at the end of the signal line 29. The grounding action part, having a cantilever structure, includes the deformable beams 23 and 24 arranged in parallel to each other, the grounding parts 28a, 28b and 28c formed in linkage with the deformable beams 23 and 24, and a grounding terminal part 26 connected to the deformable beams 23 and 24 or the grounding parts 28a, 28b and 28c. The deformable beams 23 and 24 have a parallel spring-based link structure in which the two members are integrally combined at their tips. In this Exemplary Embodiment 2, the tips of the deformable beams 23 and 24 are integrally combined in the etching process by leaving copper foils and linking them at the tips of the deformable beams 23 and 24. Among the deformable beams 23 and 24, the vertical probe 22 and the electroconductive beam 25, an insulated state is realized by removing copper foils and thereby exposing the resin film 21 in the etching process.

The vertical probe 22 corresponds to the vertical probe 12 in FIG. 1D, while the electroconductive beam 25 corresponds to the cantilever 15(0) in FIG. 1D. The deformable beams 23 and 24 respectively correspond to the cantilevers 15(2) and 15(1) in FIG. 1D. Although the deformable beams 23 and 24 are supposed to be electrically connected in common to the grounding part 28a in this Exemplary Embodiment 2, they can as well be connected to an independent electrical wiring pattern, and its method will not be described here because it can be readily presumed by persons skilled in the art. The signal line part 29 includes the signal line terminal part 27, the electroconductive beam 25 and the vertical probe 22.

The grounding action part is provided with the grounding terminal part 26 to let an electric charge escape to an external electroconductive part (circuit board or the like), and the electroconductive beam 25 has at one of its ends the vertical probe 22 for establishing contact with the pad of a semiconductor chip and at the other end the signal line terminal part 27 for establishing contact with a circuit board or the like. The vertical probe 22 and the signal line terminal part 27 are connected to each other by the wiring of the electroconductive beam 25. In the grounding action part, the grounding parts 28a, 28b and 28c are formed and connected by grounding action wiring.

The tip of the vertical probe 22 vertically protrudes from the upper end of the resin film 21, and the respective tips of the grounding terminal part 26 and the signal line terminal part 27 are formed vertically protruding from the end of the resin film 21 in the z-direction with their heights being equalized. A notable point here of the deformable beams 23 and 24 and the electroconductive beam 25 is that the wiring of each has a parallel spring structure including thin beams as shown with reference to Exemplary Embodiment 1. Although the two deformable beams 23 and 24 constitute a parallel spring-based link mechanism as wiring for grounding and the one electroconductive beam 25 is arranged as signal wiring in parallel to the two deformable beams 23 and 24, the number of parallel lines and their arrangement can be selected as desired. In other words, it is made possible to arrange plural parallel spring constituting beams in the z-direction in a state in which the positional relationship of the beam structure of the parallel springs kept as it is. This enables the sectional area of the signal wiring constituting the parallel springs to be made smaller and thereby makes possible configuration of a contactor 50 small in electrostatic capacitance.

Further, the contactor 50 in this exemplary embodiment can be functionally divided into two parts, of which one is a supporting part 30 including the vertical probe 22, the deformable beams 23 and 24 which constitute the parallel spring wiring part and the electroconductive beam 25, and the other is a fixed part 31 including the grounding terminal part 26 and the signal line terminal part 27. Thus, the supporting part 30, utilizing the deformation of the parallel springs to absorb the pressing force in the vertical direction working on the vertical probe 22 at the time of circuit testing of the semiconductor chip, makes possible parallel movement (shift) of the fixed part 31 in the vertical direction (indicated by an arrow in the drawing).

To facilitate this shift, a notch 32 is cut into the upper side of the resin film 21 near the boundary between the supporting part 30 and the fixed part 31, and similarly a cut 33 is formed into the lower side of the resin film 21 to narrow the resin film width in this part. The formation of the cut 33 also makes it possible to incline the angle arrangement of the parallel springs by θ in the horizontal direction. The shift of the vertical probe 22 in the z-direction is facilitated with the narrow-width part of the resin film 21 as the fulcrum, and at the same time buckling of the vertical probe 22 is prevented. Since the deformable beams 23 and 24 and the electroconductive beam 25 have a parallel spring structure as a whole, the movement of the vertical probe 22 in the x-direction (the lengthwise direction, namely the right-and-left direction in FIG. 3; the same applies in the rest of the description of the invention) is also restrained, to prevent the semiconductor chip pads from being rubbed.

Exemplary Embodiment 3

Figure 4:
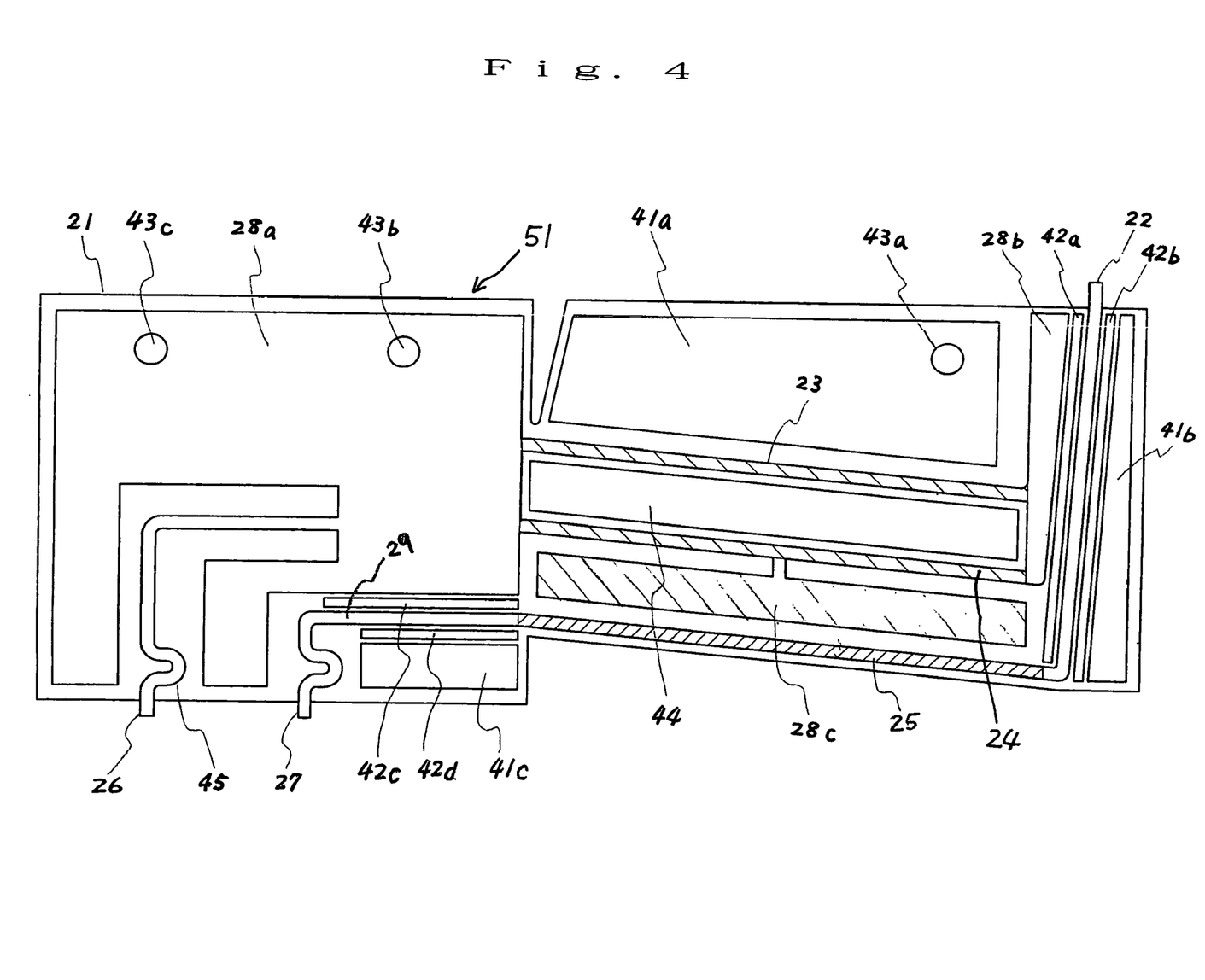
FIG. 4 shows a profile of a multiple beam-synthesized type contactor, which is a third exemplary embodiment of the invention.

FIG. 4 shows a profile of a multiple beam-synthesized type contactor, which is a third exemplary embodiment of the invention. Since this embodiment is basically the same as Exemplary Embodiment 2, only the different parts will be described, and the same parts will be denoted by respectively the same reference signs.

A feature of a contactor 51 pertaining to Exemplary Embodiment 3 is the formation of dummy parts 41a, 41b and 41c over the resin film 21 in addition to the deformable beams 23 and 24 and the electroconductive beam 25. The deformable beams 23 and 24 and the electroconductive beam 25 are involved in electric conduction while the dummy parts 41 are not. The dummy parts 41a, 41b and 41c, though they are formed at the same time as the deformable beams 23 and 24 and the electroconductive beam 25 when the copper foils are etched, are formed as electrically isolated islands as these deformable beams 23 and 24 and the electroconductive beam 25.

The dummy parts 41 are formed in a selected position where it does not obstruct electric conduction in the deformable beams 23 and 24 and the electroconductive beam 25. The dummy parts 41a, 41b and 41c as shown in FIG. 4 are in such positions. As these dummy parts are as thick as the electroconductive pattern and about four times as thick as the resin film, the contactor 51 can be provided with correspondingly greater rigidity.

This exemplary embodiment has a further feature that the gap between the deformable beams 23 and 24 and the electroconductive beam 25, that between the deformable beams 23 and 24 and the dummy parts, and that between the electroconductive beam 25 and the dummy parts, all arranged close to each other, are filled with insulating resins. As the insulating resins, an insulative adhesive made up of polyimide resin or the like is used, and fill these gaps by pattern printing. FIG. 4 shows the positions where the insulating resins 42a, 42b, 42c and 42d are formed. Thus, 42a and 42b are arranged on the two sides of the vertical part of the electroconductive beam, and 42c and 42d are arranged on the two sides of the horizontal part of the electroconductive beam.

In particular, since the vertical part of the electroconductive beam is long in the z-direction, there is a problem of susceptibility to buckling when the sectional area of the vertical probe 22 is small. In this exemplary embodiment, since the insulating resins 42a and 42b are formed on the two sides of the electroconductive beam, and the grounding part 28b and the dummy part 41b are farther formed outside them to enable insulating members to be present near the vertical probe and to play a strength augmenting role, buckling of the vertical probe can be prevented.

Further in this exemplary embodiment, the dummy part 41a (positioning dummy part) is arranged near the vertical probe 22, a hole 43a penetrating this dummy part 41a and the resin film 21 is bored, and one end of the dummy part 41b (linking dummy part) is close to the vertical probe 22. This arrangement facilitates positioning of the vertical probe, the linking dummy part and the positioning dummy part on the same plane. The hole 43a is intended to let a supporting rod (a rod used when configuring the contactor assembly and made of an insulating material) pass. This causes the surface of the linking dummy part to work exactly within the same plane as the surface of the vertical probe, resulting in a structure which hardly allows transmission of force to another contactor 51 via the hole and the supporting rod.

Holes 43b and 43c used when configuring this contactor assembly are also bored in the grounding part 28a, and contactors 51 can be stacked at suitable intervals by pressing stacking rods (supporting rods) into these holes 43a, 43b and 43c. A contactor assembly in which plural contactors 51 are stacked at desired intervals can be thereby obtained.

In this exemplary embodiment, an aperture 44 is bored in the resin film 21 near two opposing electroconductive parts 23 (the grounding terminal part 24 and the electroconductive beam 25) having a parallel spring structure. The presence of this aperture 44 enables the function of the parallel springs in the contactor 51 to be utilized better. Thus, it facilitates the parallel movement of the vertical probe.

Further in this terminal, a curved part 45 is provided in the electroconductive part near the grounding terminal part 26 and the signal line terminal part 27. This arrangement makes it possible to absorb any distortion by contact pressure arising when the grounding terminal part 26 and the signal line terminal part 27 come into conduct with an electrode of the circuit board of a testing apparatus or the like.

Exemplary Embodiment 4

Figure 5:
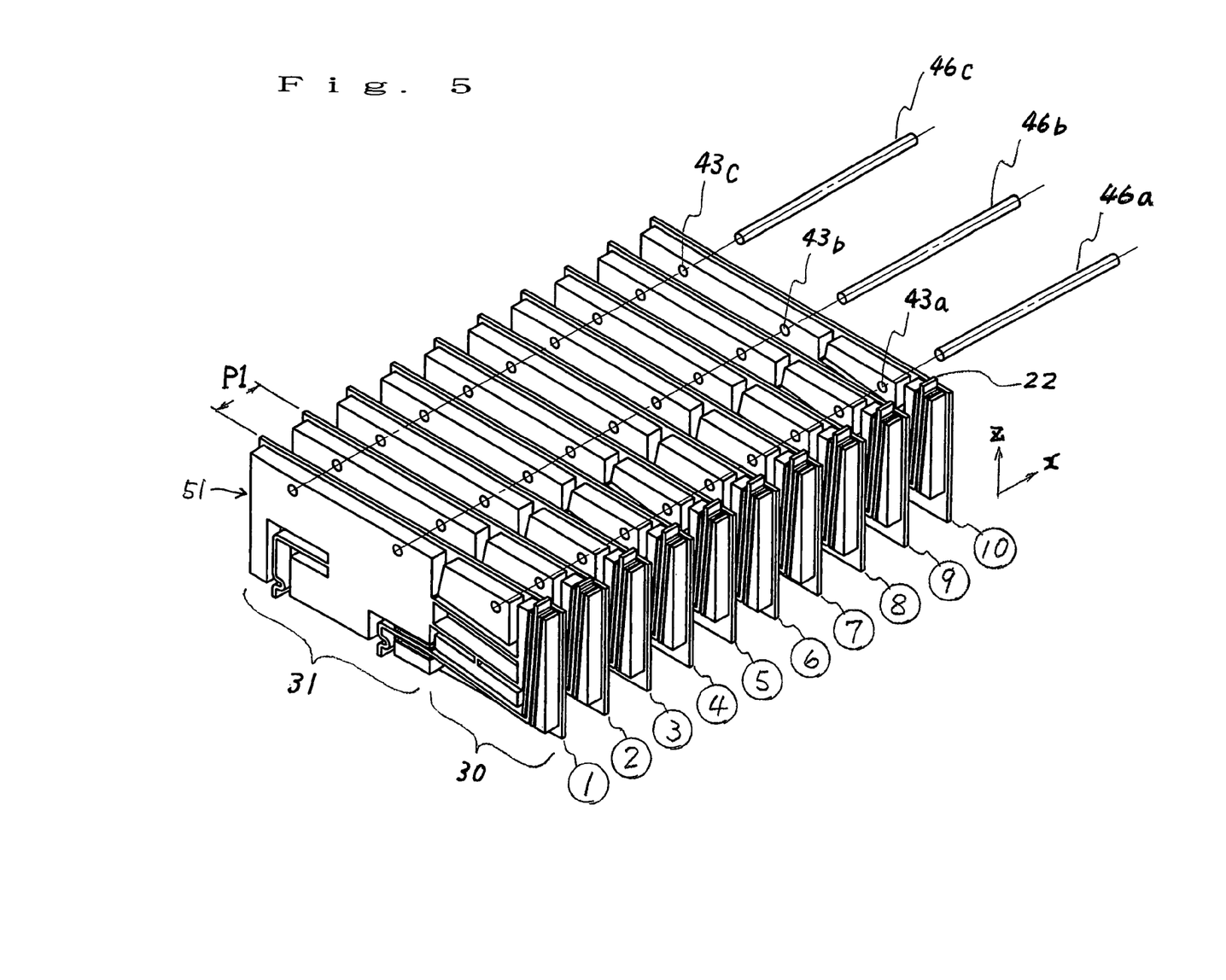
FIG. 5 shows a perspective view of the assembled structure of multiple beam-synthesized type contactors, which constitute a fourth exemplary embodiment of the invention.

Next, a multiple beam-synthesized type contactor assembly, which is a fourth exemplary embodiment of the invention, will be described with reference to FIG. 5. FIG. 5 shows a perspective view of a contactor assembly in which plural multiple beam-synthesized type contactors 51 shown in FIG. 4 are stacked in parallel. As illustrated in FIG. 5, 10 ((1) through (10)) contactors 51, for instance, of substantially the same shape at equal intervals of a pitch P1. By pressing supporting rods 46a, 46b and 46c into holes 43a, 43b and 43c bored in respectively the same positions in each contactor, the contactors can be fixed in positions of a desired pitch. In this way, ten vertical probes 22 are collectively fixed in the x-direction in FIG. 5. Further, the vertical probes 22 are enabled, when they come into contact with the pads of semiconductor chips, to move in parallel in the z-direction by the deflective deformation of cantilevers. The penetrating presence of the supporting rods enables the vertical probes to be fixed at uniform heights in the z-direction.

The supporting rods 46b and 46c here are inserted into the fixed parts 31 of the contactors 51 and, after the contactors 51 come into contact with the electrodes of the circuit board, will not be moved in the z-direction. However, the supporting rod 46a is inserted into the supporting parts 30 of the vertical probes 22, and is structurally enabled to move in the z-direction following the displacement of the vertical probes 22 in the z-direction by the contact pressure between the vertical probes 22 and the pads of semiconductor chips.

Figure 6:
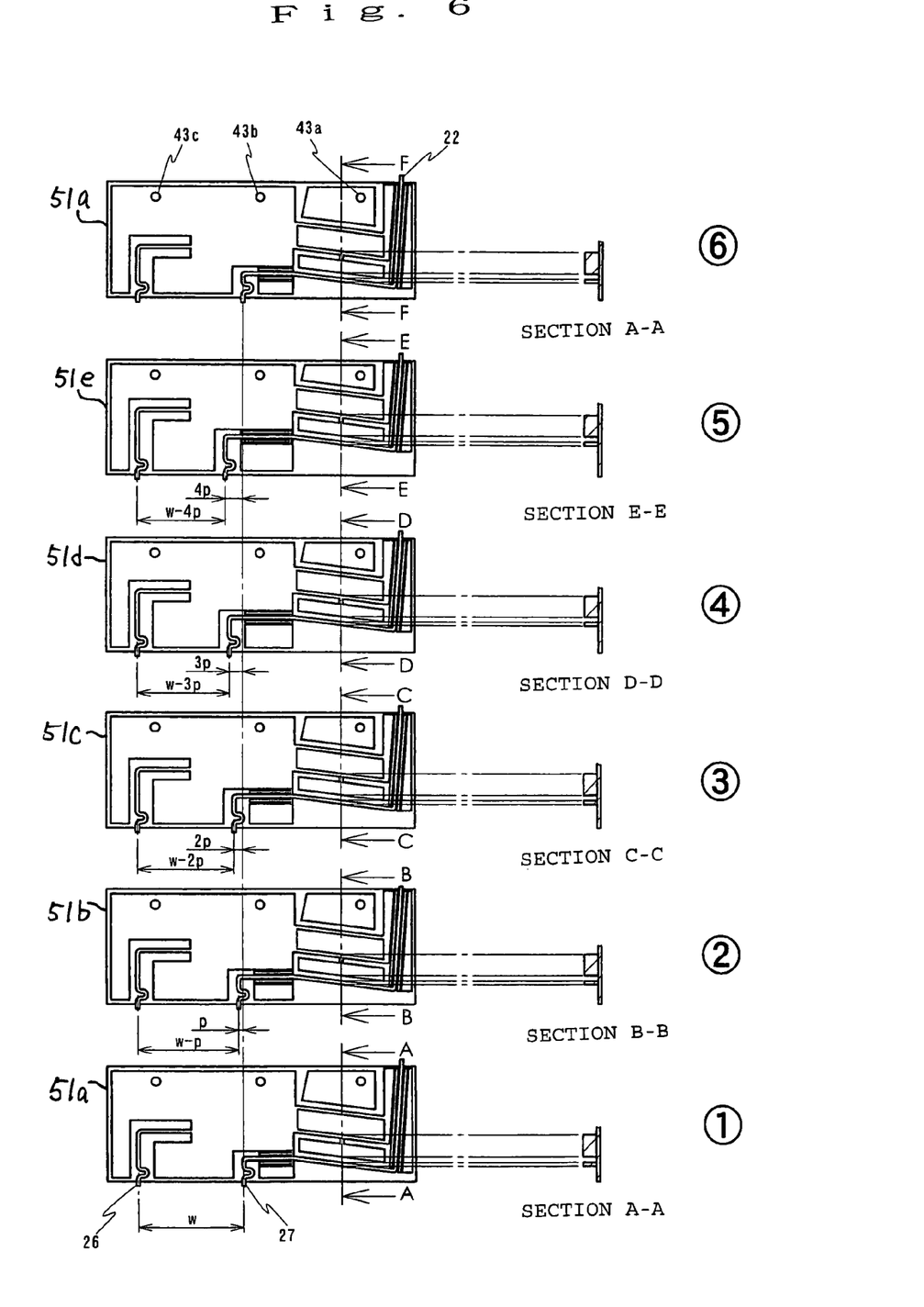
FIG. 6 shows an exploded view of the assembled structure of multiple beam-synthesized type contactors, which constitute a fifth exemplary embodiment of the invention.
Figure 7:
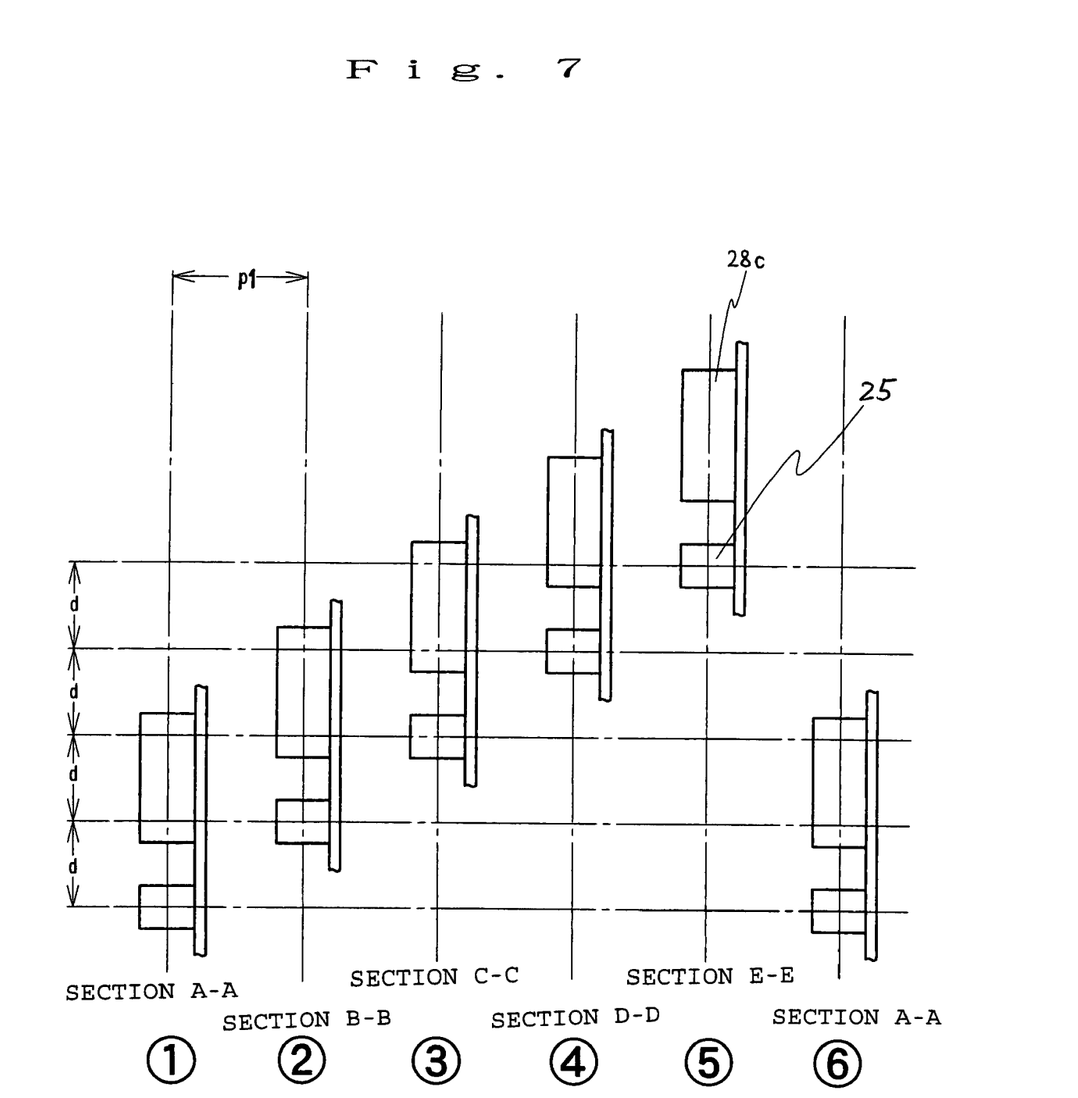
FIG. 7 illustrates the arrangement of the multiple beam-synthesized type contactors of FIG. 6.

Each of the contactors 51 stacked as described above will be described in further detail. FIG. 6 shows a contactor assembly by extracting six ((1) through (6)), for instance, of the stacked contactors 51. The contactors 51, though having basically the same structures, are slightly structurally different among individual contactors 51a, 51b, 51c, 51d and 51e. The structural differences include, with reference to the contactor 51a and the contactor 51b for instance, a difference in spacing between the grounding terminal part 26 and the signal line terminal part 27 between the contactors 51a and 51b as shown in FIG. 6. Thus, while the spacing between the grounding terminal part 26 and the signal line terminal part 27 is W in the contactor 51a, the spacing in the contactor 51b is (W−P), and therefore the signal line terminal part 27 in the contactor 51b is closer to the grounding terminal part 26 by P than in the contactor 51a. The installed position of the grounding terminal part 26 in the contactors 51a, 51b, 51c, 51d and 51e are the same. Similarly, between the contactor 51b and the contactor 51c, as shown in FIG. 6, while the spacing between the grounding terminal part 26 and the signal line terminal part 27 is (W−P) in the contactor 51b, the spacing in the contactor 51c is (W−2P), which means that the signal line terminal part 27 in the contactor 51c is closer to the grounding terminal part 26 by P than in the contactor 51b. Therefore, to compare the contactor 51a with the contactor 51c, the signal line terminal part 27 in the contactor 51c is closer to the grounding terminal part 26 by 2P than in the contactor 51a. Similarly hereinafter, in the contactor 51d, the signal line terminal part 27 is closer to the grounding terminal part 26 by P than in the contactor 51c, and in the contactor 51e, the signal line terminal part 27 is closer to the grounding terminal part 26 by P than in the contactor 51d. What is stacked behind the contactor 51e is the same as the contactor 51a. The installation in this way of the signal line terminal part 27 between each adjoining pair of the contactors 51a, 51b, 51c, 51d and 51e lagged by P toward the grounding terminal part 26 enables the pitch of the signal line terminal parts 27 (which is P2) to be made greater than that of the vertical probes 22 (which is P1).

The size of P2 is calculated in the following way:

$$P2=(P1^2+P^2)^{1/2}$$

For this reason, where the multiple beam-synthesized type contactor assembly is used for circuit testing of semiconductor chips, even if the pitch of electrodes disposed over the circuit board is greater than that of the pads of the semiconductor chips (as it actually is), the vertical probes 22 and the pads of the semiconductor chips can be aligned with each other, and at the same time the signal line terminal parts 27 and the electrodes over the circuit board can also be aligned.

In this way, this exemplary embodiment enables assembling of contactors 51 which are small in electrostatic capacitance because adjoining signal lines therein are not in the same position, and accordingly a high frequency-compatible contactor assembly can be configured. Furthermore, by appropriately contriving the sequence of arrangement, such as grouping odd-number ones and even-number ones, the adjoining signal lines are segregated from each other by plural pitches, resulting in producing a magnetic shield effect and an electrostatic capacitance reducing effect. Sparse distribution of the output terminals of signal lines serves to simplify the traffic of signals between the terminals back and forth.

Although the present invention has been described with reference to illustrated exemplary embodiments of thereof, it must be obvious to persons skilled in the art that the invention can be readily altered or modified without deviating from the true spirit and concept thereof. The invention also covers such alterations and modifications.

What is claimed is:

1. A multiple beam-synthesized type contactor assembly, each contactor comprising:
   a resin film constituting a base material;
   an electroconductive pattern formed over the resin film and made up of an electric conductor including a vertical probe;
   an electroconductive beam having a linear or curvilinear shape of which one end is fixed and the other is connected to the vertical probe; and
   one or a plurality of deformable beams extending substantially in parallel to the electroconductive beam,
   wherein the electroconductive beam and deformable beam (s) are firmly fixed mechanically in the vicinity of the vertical probe to constitute a cantilever of a parallel spring structure;
   the electroconductive beam and deformable beam(s) have an electrical characteristic of being electrically conductive or electrically non-conductive; and
   a plurality of the resin films each with a vertical probe are stacked, and circuit testing of semiconductor chips is carried out by collectively bringing the tips of the vertical probes into contact with the electrode pads of the semiconductor chips.

2. The contactor assembly according to claim 1, wherein the electroconductive pattern comprises one or a plurality of grounding lines and one or a plurality of signal lines.

3. The contactor assembly according to claim 1, wherein a plurality of parallel spring links are provided in a z-direction in a state in which the positional relationship of a link configuration of the parallel springs is maintained.

4. The contactor assembly according to claim 1, wherein patterns having greater areas among electroconductive patterns in the multiple beam-synthesized type contactor assembly constitute the fixed ends of the electroconductive beam and of the deformable beam(s).

5. The contactor assembly according to claim 1, wherein adjoining signal lines are arranged in a grouped manner.

6. The contactor assembly according to claim 1, wherein each parallel spring type contactor formed of a parallel spring link mechanism having a parallel spring structure with the utilization of the two or more electroconductive patterns has the vertical probe at one end and has a cantilever structure extending in the horizontal direction as a supporting part at the other end.

7. The contactor assembly according to claim 1, wherein the parallel spring structure in which the two or more electroconductive patterns are utilized is a link mechanism deformed by bending.

8. The contactor assembly according to claim 1, wherein an aperture is bored in a resin film between two opposing electroconductive patterns having the parallel spring configuration.

9. The contactor assembly according to claim 1, wherein a notch is cut into a resin film near a supporting part of the parallel springs to enable the parallel springs to move in parallel.

10. The contactor assembly according to claim 1, wherein the vertical probes are connected to one another via a link mechanism and an electroconductive pattern, the assembly being further provided with a terminal part which comes into contact with connecting pads of a circuit board.

11. The contactor assembly according to claim 1, wherein a wiring part is formed in the terminal part over each resin film so that arranged positions of the resin films with vertical probes, when they are stacked, lag from one to next at an equal pitch.

12. The contactor assembly according to claim 1, wherein a curved part is provided in the electroconductive pattern near the terminal part.

13. The contactor assembly according to claim 1, wherein the link mechanism and terminal part have a cut formed in the vicinity thereof and are cantilever-structured.

14. The contactor assembly according to claim 1, wherein the multiple beam-synthesized type contactor assembly is a link structure inclined in the horizontal direction by an angle θ and the extent of scribing (rubbing) between the vertical probes and pads on a tested wafer can be varied by varying the angle θ.

15. The contactor assembly according to claim 1, wherein the contactor assembly has electroconductive patterns or electroconductive wiring lines differing in length and a supporting rod inserted into a hole in the contactor assembly, and further has vertical probes arrayed in one array or two which enable electrical connection to sparsely distributed electrodes of a circuit board.

16. The contactor assembly according to claim 1, wherein the contactor assembly has electroconductive patterns or electroconductive wiring lines differing in length, and further has sparsely distributed output terminals (vertical probes).

17. The contactor assembly according to claim 1, wherein the contactor assembly has grounding part output terminals differing in length, and further has sparsely distributed grounding part output terminals.

18. The contactor assembly according to claim 1 or 5, wherein there is a positioning dummy part near the vertical probe, a hole is bored to establish communication between the positioning dummy part and the resin film, and the vertical probe, one end of a linking dummy part and the positioning dummy part are caused to form the same plane by the proximity between the vertical probe and the linking dummy part.

19. The contactor assembly according to claim 1 or 5, wherein a surface of the linking dummy part acts exactly within the same plane as a surface of the vertical probe, and force is hardly transmitted to any other contactor assembly via a hole and a supporting rod inserted into the hole.

20. The contactor assembly according to claim 1 or 5, wherein the contactor assembly is so arranged as to cross orthogonally.

21. The contactor assembly according to claim 1 or 5, wherein the fixed part of parallel springs is fixed with one or more resin materials which are in an electrically insulated state.

22. The contactor assembly according to claim 1 or 5, wherein two or more electrically insulated contactors (hereinafter to be referred to as plurality of contactors) are configured in a parallel spring structure, the assembly further having a plurality of dummy parts in contact with the plurality of contactors with certain gaps in-between, the certain gaps being filled with an insulative resin material, and the plurality of contactors and the plurality of dummy parts constituting a parallel spring structure.

23. The contactor assembly according to claim 1 or 5, wherein a stacked contactor assembly comprising the plurality of contactors and substantially the same contactor assembly or assemblies are arrayed at prescribed intervals in an x-direction.

24. The contactor assembly according to claim 1 or 5, wherein stacked contactor assemblies each comprising the plurality of contactors are arrayed at prescribed intervals in a thickness direction and opposed to a plurality of arrayed pads.

25. The contactor assembly according to claim 1 or 5, wherein the contactor assembly using a resin film to which the copper foil is stuck, the copper foil being etched to form an electroconductive pattern including a vertical probe over the resin film, a plurality of such resin films each with a vertical probe being stacked and the tips of the vertical probes being collectively brought into contact with the electrode pads of semiconductor chips to subject the semiconductor chips to circuit testing, wherein the electroconductive pattern including the vertical probe constitutes a link mechanism of parallel springs having a parallel spring structure, two or more of electroconductive patterns of the vertical probes are utilized and synthesized in the parallel spring mechanism configuration, and a plurality of the electroconductive patterns including the vertical probes are arranged in an x-direction.

26. The contactor assembly according to claim 1 or 5, wherein a curved shape is configured in the electroconductive pattern to shorten a distance of vertical movement (the extent of overdrive) in an x-direction.

27. The contactor assembly according to claim 1 or 5, wherein a plurality of terminal parts are so formed over the resin film as to be uniform in height in a z-direction.

28. The contactor assembly according to claim 1 or 5, further having two or more contactors which simultaneously come into contact and establish conduction with adjoining electrode pads of the semiconductor chips.

29. Contactor assemblies according to claim 1 or 5, wherein the contactor assemblies are arrayed in orthogonal crossing to match electrode pads arrayed in a multi-chip or rectangular zigzag pattern.

30. Contactor assemblies according to claim 1 or 5, further having, in the completely assembled state of the contactor assemblies, a contactor assembly or assemblies wired in the rightward direction and a contactor assembly or assemblies wired in the leftward direction.

31. A multiple beam-synthesized type contactor assembly, each contactor comprising:
   a resin film constituting a base material;
   an electroconductive pattern formed over the resin film and made up of an electric conductor including a vertical probe;
   an electroconductive beam forming a parallel spring link mechanism having a parallelogrammatic shape and connected to the vertical probe;
   two or more deformable beams provided integrally with the electroconductive beam; and
   a dummy part provided in the parallel spring link mechanism part in a state of being electrically insulated from the electroconductive beam,
   wherein a plurality of such resin films each with a vertical probe are stacked, and circuit testing of semiconductor chips is carried out by collectively bringing the tips of the vertical probes into contact with the electrode pads of the semiconductor chips.

32. The contactor assembly according to claim 31, wherein other parts than the electroconductive pattern, when a copper foil is etched, are not removed but left to form a dummy part, which is used as a reinforcing member for the resin film.

33. The contactor assembly according to claim 31, wherein resin film surfaces between the electroconductive pattern and the dummy part are filled with an insulative adhesive.

34. The contactor assembly according to claim 31, wherein a dummy part formed of a copper foil and electrically insulated from the electroconductive pattern is formed over the resin film, and a resin printing part or parts (insulative adhesive) are formed at least between one electroconductive pattern and another electroconductive pattern or between an electroconductive pattern and the dummy part.

35. The contactor assembly according to claim 31, wherein a dummy part and a resin printing part are disposed adjoining the vertical probe to restrain buckling of the vertical probe.

36. The contactor assembly according to claim 31, wherein the dummy part and a grounding part, together with the resin film, are penetrated by a through hole.

\* \* \* \* \*